United States Patent [19]

Shupe et al.

[11] Patent Number: 4,937,765
[45] Date of Patent: Jun. 26, 1990

[54] METHOD AND APPARATUS FOR ESTIMATING FAULT COVERAGE

[75] Inventors: Paul A. Shupe, Beaverton; Michael E. Ausec, Tigard; William C. Berg; William C. Diss, both of Beaverton, all of Oreg.

[73] Assignee: Mentor Graphics Corporation, Beaverton, Oreg.

[21] Appl. No.: 226,430

[22] Filed: Jul. 29, 1988

[51] Int. Cl.⁵ .................. G06F 11/00; G06F 15/60
[52] U.S. Cl. .................. 364/570; 364/578; 364/488; 371/23; 371/25.1
[58] Field of Search .................. 364/488–490, 364/570, 578; 371/23'25; 324/73 R, 73 AT, 73 PC

[56] References Cited

U.S. PATENT DOCUMENTS

| | | | |
|---|---|---|---|
| 3,649,910 | 3/1972 | Vinsani et al. | 324/73 |
| 3,715,573 | 2/1973 | Vogelsberg | 235/153 AC |
| 3,775,598 | 11/1973 | Chao et al. | 235/153 AC |
| 3,780,277 | 12/1973 | Armstrong et al. | 235/153 AC |
| 4,156,132 | 5/1979 | Hazzard | 371/23 |
| 4,308,616 | 12/1981 | Timoc | 371/23 |
| 4,601,032 | 7/1986 | Robinson | 371/23 |
| 4,771,428 | 9/1988 | Acuff et al. | 371/25 |
| 4,773,028 | 9/1988 | Tallman | 371/25 |
| 4,791,357 | 12/1988 | Hyduke | 371/25 |
| 4,791,578 | 12/1988 | Fazio et al. | 364/488 |
| 4,791,593 | 12/1988 | Hennion | 364/488 |
| 4,817,012 | 3/1989 | Cali | 364/488 |

OTHER PUBLICATIONS

Jain et al., "Stafan: An Alternative to Fault Simulation," ACM/IEEE 21st Design Automation Conference Proceedings (Jun. 1984).
Hi Keung Ma et al., "Mixed-Level Fault Coverage Estimation," IEEE 23rd Design Automation Conference (1986).
"Product Description Stategrade," Gareway Design Automation Corporation, 1988.
"Gateway Claims It Has the First Complete Statistical Fault Analyzer," EE Times, 1988.

Primary Examiner—Parshotam S. Lall
Assistant Examiner—Brian M. Mattson
Attorney, Agent, or Firm—Klarquist, Sparkman, Campbell, Leigh & Whinston

[57] ABSTRACT

Method and apparatus estimates fault coverage of a set of test vectors to be applied to a circuit containing sequential elements. The apparatus permits sequential elements to be represented as functional blocks rather than combinational circuits with feedback. This is accomplished by taking into account the external state of the sequential element during circuit simulation. The apparatus also takes into account high impedance as possible inputs and outputs.

14 Claims, 14 Drawing Sheets

FIG. 4A
Fault-Free D-Flipflop Circuit Element

FIG. 4B
Faulty Copies of the D-Flipflop

FIG. 3B
Test Patterns For Example Circuit

| TIME | Test Pattern Applied | | | Circuit Response | | |
|---|---|---|---|---|---|---|
| | A | B | C | D | E | F |
| 10 | 1 | 1 | 0 | 1 | 1 | 1 |
| 20 | 1 | 0 | 0 | 0 | 1 | 1 |
| 30 | 0 | 1 | 1 | 0 | 0 | 0 |

FIG. 3C
Control Probabilities For Test Program

| Control Statistic | Number of Times Pin is Sampled at '0' and '1' | | | | | |
|---|---|---|---|---|---|---|
| | A | B | C | D | E | F |
| C0 | 1 | 1 | 2 | 2 | 1 | 1 |
| C1 | 2 | 2 | 1 | 1 | 2 | 2 |

FIG. 3D
Sensitivity Statistics Measured For Each Element

| Input/Output Combinations | | Type of Sensitivity Statistic Measured | | | | | |
|---|---|---|---|---|---|---|---|
| | | L00 | L01 | L0Z | L10 | L11 | L1Z |
| Gate 1 | (A, D) | 1 | 0 | 0 | 0 | 1 | 0 |
| | (B, D) | 1 | 0 | 0 | 0 | 1 | 0 |
| Gate 2 | (C, E) | 0 | 2 | 0 | 1 | 0 | 0 |
| Gate 3 | (D, F) | 1 | 0 | 0 | 0 | 0 | 0 |
| | (E, F) | 1 | 0 | 0 | 0 | 1 | 0 |

FIG. 3E Calculated Probabilities of Observation

| Observation Probability | Probability that a Pin is Observed at a Primary Output whenever it is '0' or '1' | | | | | |
|---|---|---|---|---|---|---|
| | A | B | C | D | E | F |
| B0 | 1/2 | 1/2 | 1/2 | 1/2 | 1.0 | 1.0 |
| B1 | 0 | 0 | 1/2 | 0 | 1/2 | 1.0 |

FIG. 3F Biased Probabilities of Detection for Each Pin

| Biased Detection Probabilities | Individual Pins in the Circuit | | | | | |
|---|---|---|---|---|---|---|
| | A | B | C | D | E | F |
| D0' | 0 | 0 | 1/6 | 0 | 1/3 | 2/3 |
| D1' | 1/6 | 1/6 | 1/3 | 1/3 | 1/3 | 1/3 |

FIG. 3G Unbiased Probabilities of Detection

| Unbiased Detection Probability | Individual Pins in the Circuit | | | | | |
|---|---|---|---|---|---|---|
| | A | B | C | D | E | F |
| D0 | 0 | 0 | 0.807 | 0 | 0.950 | 0.998 |
| D1 | 0.807 | 0.807 | 0.950 | 0.950 | 0.950 | 0.950 |

FIG. 3H Comparison of Fault Grading Results

| Fault Grading Results | Statistical Fault Analysis | Deterministic Fault Simulation |
|---|---|---|
| Percentage of Detected Faults | 68% | 66% |
| Faults which were determined to be Undetected with the given Test Patterns | Stuck-At-0 on A<br>Stuck-At-0 on B<br>Stuck-At-0 on D | Stuck-At-0 on A<br>Stuck-At-0 on B<br>Stuck-At-0 on D<br>Stuck-At-1 on B |

FIG. 4C  D-Flipflop Stimulus, with Shadow Copy Response

| Fault-Free Circuit Stimulus and Response | | | | Shadow Copy Output Values (Q) | | | | | |
|---|---|---|---|---|---|---|---|---|---|
| | | | | D | | CK | | CLR | |
| TIME | D | CK | CLR | Q | SA0 | SA1 | SA0 | SA1 | SA0 | SA1 |
| 0 | 0 | 0 | 1 | 0 | 0 | 0 | 0 | 0 | X | 0 |
| 10 | 0 | 0 | 0 | 0 | 0 | 0 | 0 | 0 | X | 0 |
| 20 | 0 | 1 | 0 | 0 | 0 | 1 | 0 | 0 | 0 | 0 |
| 30 | 1 | 0 | 0 | 0 | 0 | 1 | 0 | 0 | 0 | 0 |
| 40 | 1 | 1 | 0 | 1 | 0 | 1 | 0 | 0 | 1 | 0 |
| 50 | 1 | 0 | 0 | 1 | 0 | 1 | 0 | 0 | 1 | 0 |

FIG. 4D  Prior Method Applied to D-Flipflop

| Fault-Free Machine Stimulus | | | | Shadow Copy Output Values (Q) for Each Input Pin Toggled | | | | | |
|---|---|---|---|---|---|---|---|---|---|
| | | | | D | | CK | | CLR | |
| TIME | D | CK | CLR | Q | "0" | "1" | "0" | "1" | "0" | "1" |
| 0 | 0 | 0 | 1 | 0 | | 0 | | 0 | 0 | |
| 10 | 0 | 0 | 0 | 0 | | 0 | | 0 | | 0 |
| 20 | 0 | 1 | 0 | 0 | | 1 | 0 | | | 0 |
| 30 | 1 | 0 | 0 | 0 | 0 | | | 0 | | 0 |
| 40 | 1 | 1 | 0 | 1 | 0 | | 0 | | | 0 |
| 50 | 1 | 0 | 0 | 1 | 1 | | | 1 | | 0 |

FIG. 4E  L-term Statistics for the D-Flipflop

| Input/Output Combination | L-term Statistics Measured for each Input/Output Pair | | | | | |
|---|---|---|---|---|---|---|
| | L00 | L01 | L0Z | L10 | L11 | L1Z |
| (D, Q) | 2 | 0 | 0 | 0 | 2 | 0 |
| (CK, Q) | 0 | 2 | 0 | 0 | 2 | 0 |
| (CLR, Q) | 0 | 2 | 0 | 0 | 0 | 0 |

METHOD AND APPARATUS FOR ESTIMATING FAULT COVERAGE

BACKGROUND OF THE INVENTION

This invention relates to the detection of faults in a digital circuit. More particularly, this invention relates to a statistics-based method and apparatus for estimating the fault coverage of a set of test vectors applied to a digital circuit that contains sequential circuit elements.

Fault simulators, which are known in the art, allow a circuit designer to model manufacturing defects in a circuit and thereby determine if a given set or program of test patterns (also known as test vectors) can detect an acceptable percentage of faults that may occur in the circuit. Faults that can commonly occur in integrated circuits are metallization runs that are stuck open or stuck shorted. Faults that can occur in printed circuit boards include shorted adjacent runs, shorted adjacent pins, open runs, or shorts to ground or the supply voltage.

In conventional deterministic fault simulation, the simulator creates a faulty circuit by tying the value of pins of circuit elements within a circuit design high or low to insert a single fault for the entire length of a test set. The simulator then applies the set of test vectors chosen by the designer and compares the simulation results for the faulty circuit with that of a fault-free simulation. The inputs of the circuit to which the test vectors are applied are called primary inputs, and the outputs of the circuit from which the results are read are called primary outputs. The primary inputs and primary outputs correspond to the input and output nets or pins of an integrated circuit, respectively, or to the edge connectors and test points of a circuit board. In either case, an inserted fault is considered detected if there is a difference between the logic state of a primary output in the faulty simulation and in the fault-free simulation.

The extent to which a set of test vectors can detect faults is called fault coverage. For example, if a set of test vectors provides 90 percent fault coverage, it can detect 90 percent of all simulated stuck-at-1 and stuck-at-0 faults in the circuit. The extent of fault coverage depends on two factors: the inherent testability of the logic design and the comprehensiveness of the set of test vectors. By continuously improving the design and the set of test vectors and rerunning the fault simulator, a designer can achieve close to 100 percent fault coverage.

Deterministic fault simulation, although exact, demands considerable computing resources. By one study, the CPU time and memory requirements for such fault simulation are proportional to the square of the number of gates in the circuit. This resource demand makes fault simulation a lengthy and costly process for board level design and for designing integrated circuits in the very large scale integrated (VLSI) range.

One approach suggested for reducing the demand on computing resources employs the random sampling of faults. This method simulates a randomly selected subset of faults to give an estimate of the fault coverage. Accuracy of the coverage depends only upon the number of simulated faults, not on the total number of faults in the circuit. Random sampling techniques, however, fall short in that they give no information about the detectability of non-sampled faults.

Another approach is to distribute fault simulation over a number of networked computers. At each computer, a circuit representation is provided with a unique subset of the faults. The faults are thus distributed among multiple copies of the circuit design. The design is then simulated simultaneously on multiple computers. With appropriate partitioning of the faults, the reduction in simulation time is directly proportional to the number of computers.

Despite these approaches for improving fault simulation, the basic deterministic method remains slow and resource intensive. Total CPU time is not reduced but merely distributed over a number of nodes by running portions of the fault simulator simultaneously.

As an alternative to conventional fault simulation, statistical fault analysis has been proposed. Jain and Agrawal, in their article "STAFAN: An Alternative to Fault Simulation," Proceedings of 21st Design Automation Conference, June 1984, pp. 18-23, describe statistical fault analysis as a method of estimating statistically the percent of fault coverage for a given set of test vectors. Instead of running a deterministic fault simulator several times to develop test vectors, statistical fault analysis enables the designer to estimate the fault coverage of a test vector set by statistical calculations. In their study, the described method provided fault coverage within 5 percent of fault simulator results, without the CPU time and memory demands required of deterministic fault simulation. The analysis method is typically rerun several times with additional test patterns until the coverage percentage reaches a desired level. The fault coverage is then verified with a single run through a fault simulator. STAFAN, however, is limited to circuits modeled with basic Boolean gates. If a more complex circuit element such as a multiplexer is to be modeled, it must first be broken down into its basic gate structure. Such a design process places an undue burden on the circuit designer.

The initial work of Jain and Agrawal was advanced by Hi Keung Ma and Alberto L. Sangiovanni-Vincentelli in their article "Mixed-Level Fault Coverage Estimation," Proceedings of the 23rd Design Automation Conference 1986, pp 553-559. There, the authors applied statistical fault analysis to combinational multiple-input, multiple-output functional blocks. With the described method, the circuit designer need only specify the functional relationship between each input and output of the block. For example, if a functional block consists of a multiple gate level combinational circuit element, only the relationship between the inputs and outputs of the circuit must be specified. The Jain method, by contrast, requires that each gate be individually examined.

Despite this advancement, commercial development of statistical fault analyzers has been lackluster. One stumbling block has been the inability to develop a viable method of estimating fault coverage in sequential functional blocks. Sequential circuit elements can be modeled with the methods described above, but only by modeling them as combinational gates or blocks. For example, a D flip-flop must be modeled at its gate level, with statistics generated for each gate within the flip-flop. Caedent Corp. of Colorado Springs, Colo., now owned by the assignee of the present invention, had developed a proprietary method for handling sequential functional blocks. But, the method estimated rather than measured key parameters and required a separate statistical model for each type of sequential functional block. For example, a new type of sequential block employed in a circuit design required that a new statistical model be crafted for that block, based on its internal functionality. The accuracy of the models were difficult to maintain as the models increased in complexity.

SUMMARY OF THE INVENTION

An object of the invention, therefore, to provide an improved statistical method and apparatus for estimating fault coverage of a given set of test vectors for a circuit.

Another object of the invention is to provide such a method that is capable of estimating fault coverage of the set of test vectors for circuits that contain sequential circuit elements.

Another object of the invention is to provide such an improved method that identifies undetected faults.

Still another object of the invention is to provide such an improved method that accurately measures the sensitivity of sequential circuit elements.

Yet another object of the invention is to provide an improved statistical fault analysis method that takes into account the high impedance state of a circuit element in determining sensitivity.

A method of estimating fault coverage takes into account high impedance as a state in measuring the sensitivity through circuit elements. The method is also capable of estimating fault coverage for circuits that contain sequential circuit elements. Single-level fault simulation of the fault-free element and faulty copies of the element is employed to measure the sensitivity through a sequential circuit element.

The foregoing and other objects, features, and advantages of the invention will become more apparent from the following detailed description of a preferred embodiment which proceeds with reference to the accompanying drawings.

DETAILED DESCRIPTION

The present invention is a statistical-based method and apparatus for estimating fault coverage of a set of test vectors to be applied to a circuit under test. The invention is particularly suited for circuits that include sequential circuit elements. Before describing the present method and apparatus in detail, however, a brief review of statistical fault analysis is desirable. With that as background, the present method of calculating observation probabilities with sensitivity statistics and high impedance terms will be described. Single-level fault simulation to measure the sensitivity statistics is then explained. Finally, the present method and apparatus for estimating fault coverage is described and illustrated.

To assist in better understanding the present invention, the following glossary of terms used herein is provided:

circuit element—a component or functional block for a circuit design, such as an AND gate or D flip-flop pin—an external connection of circuit element, e.g., an input pin or output pin net—a signal carrying entity in the circuit design such as a wire that connects pins stuck-at-fault—a single pin on a circuit element tied to a value, usually 1 or 0 logic state faulty circuit—a circuit having a single stuck-at-fault applied to a pin of a circuit element fault-free circuit—a circuit having no faults therein observing a pin—given a faulty circuit that has a pin $p_a$ stuck-at-1 (stuck-at-0) and a fault-free circuit, if pin $p_a$ is at a logic state of 0 (logic state of 1) in the fault-free circuit a time $t_N$, then pin $p_a$ is observed at pin $p_b$ if and only if at some time greater than or equal to $t_N$ the state of pin $p_b$ in the fault-free circuit differs from the state of pin $p_b$ in the faulty circuit sensitivity—the observing of a pin across a circuit element.

The statistical fault analysis method employed herein can be broken into two parts. One part comprises data collection, wherein statistics are gathered that represent the circuit behavior while the test set or program is being applied. These statistics, which will be referred to as C-terms and L-terms herein, are measured by periodically sampling the circuit state during the simulation of the test program. These statistics represent the circuit behavior at each sample time frame. The second part comprises the actual analysis. Here, the topology of the circuit and the gathered statistics are combined to determine the estimated fault coverage through the calculation of observation probabilities and detection probabilities, or B-terms and D-terms, respectively, as explained hereafter.

Statistical Fault Analysis

Controllability, Observability, and Detectability

Central to the understanding of statistical fault analysis are the concepts of controllability, observability, and detectability. These concepts are discussed at length in the Jain and Hi Keung Ma articles cited above. The present invention also employs these concepts. It differs from prior analysis techniques in, among other things, the method of calculating observability.

Controllability, or control probability C, is defined as the number of sampling time frames in which a pin $p_j$ of a circuit element in a circuit model is driven to a predetermined logic state by the test vectors applied to the circuit model. For example, $C1(p_j)$ is the number of sampling time frames in which pin $p_j$ is driven to 1 by the vectors in the test program under evaluation. Similarly, $C0(p_j)$ is the number of sampling time frames in which pin $p_j$ is driven to 0 by the test vectors:

$C1(p_j)$=one count;

$C0(p_j)$=zero count;

Observability, or observation probability B, as defined in the glossary, is the probability of observing pin $p_j$ at a primary output when the state of pin $p_j$ is 1 (0). For example, $B1(p_j)$ is the probability of observing pin $p_j$ at a primary output when the logic state of pin $p_j$ is 1. Similarly, $B0(p_j)$ is the probability of observing $p_j$ at a primary output when the logic state of pin $p_j$ is 0.

The probability of detection $D'$ for a stuck-at-0 or a stuck-at-1 fault is then calculated with the following equations:

Equation 1

$$D0'(p_j) = \frac{C1(p_j)B1(p_j)}{N}$$

Equation 2

$$D1'(p_j) = \frac{C0(p_j)B0(p_j)}{N}$$

where N is the total number of sampling time frames; $D0'(p_j)$ is the probability that a stuck-at-0 fault on pin $p_j$ is detected; and $D1'(p_j)$ is the probability that a stuck-at-1 fault on pin $p_j$ is detected.

As explained in the Jain article referenced above, the detection probabilities $D'$ are statistical estimates that, given a finite number of test vectors in the test program, contain a random error. This error leads to a biased estimation of fault coverage. The following equations are employed to unbias each detection probability $D'$:

Equation 3

$$D0(p_j) = 1 - \frac{(1 - D0'(p_j))N}{W(D0'(p_j))}$$

Equation 4

$$D1(p_j) = 1 - \frac{(1 - D1'(p_j))N}{W(D1'(p_j))}$$

where

Equation 5

$$W(D0'(p_j)) = 1 + \frac{(N-1)}{6} \beta^2 \cdot \frac{D0'(p_j)}{1 - D0'(p_j)}$$

Equation 6

$$W(D1'(p_j)) = 1 + \frac{(N-1)}{6} \beta^2 \cdot \frac{D1'(p_j)}{1 - D1'(p_j)}$$

and N is the number of sampling time frames; $\beta$ is a constant of proportionality which is determined empirically; and $D0(1)$ is the unbiased probability of detection for pin $p_j$. The present invention uses a value of 25 for $\beta^2/6$.

Once all of the individual unbiased detection probabilities D have been calculated, the estimated percentage of faults detected (also known as the cutoff percentage) is determined by computing their arithmetic mean. Each unbiased detection probability D is then compared against the cutoff percentage to classify each stuck-at fault as undetected, potentially detected, or detected:

$D0(p_j) = 0$ or $D1(p_j) = 0$  Undetected Fault-should be the target of further test generation.

cutoff $> D0(p_j)$ or $D1(p_j) > 0$  Potentially Detected Fault-statistically uncertain whether this fault was detected.

$D0(p_j)$ or $D1(p_j) \geq$ cutoff  Detected Fault.

Calculating the Observation Probability B At an Input Pin of an Instance

In the method of the invention, the observation probabilities, or B terms, are calculated with the following equations:

Equation 7

$$B0(i_j, o_k) = B0(o_k)\frac{L00(i_j, o_k)}{C0(i_j)} + B1(o_k)\frac{L01(i_j, o_k)}{C0(i_j)} + BZ(o_k)\frac{L0Z(i_j, o_k)}{C0(i_j)}$$

Figure 1:
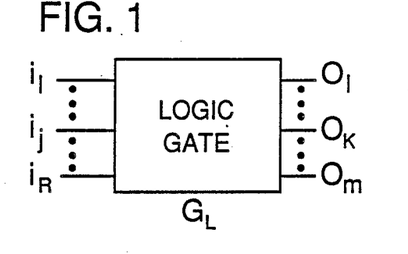
FIG. 1 is a functional block with multiple input and output pins.

Equation 8

$$B1(i_j, o_k) = B0(o_k)\frac{L10(i_j, o_k)}{C1(i_j)} + B1(o_k)\frac{L11(i_j, o_k)}{C1(i_j)} + BZ(o_k)\frac{L1Z(i_j, o_k)}{C1(i_j)}$$

where, as indicated in FIG. 1, pin $i_j$ is an input pin to an element $G_L$ having N input pins and pin $o_k$ is one of M output pins of the element. As will be described, these equations are employed to "work back" from the primary outputs through each level of elements to the primary inputs in a breadth-first search method.

The term $B0(o_k)$ is the probability of observing pin $o_k$ at a primary output when the logic state of pin $o_k$ is 0. $B1(o_k)$ is the probability of observing pin $o_k$ at a primary output when the logic state of pin $o_k$ is 1. These B terms were therefore either previously calculated (as applying to an input pin of another element connected by a net to pin $o_k$) via Equations 7 and 8 or, if $o_k$ is a primary output, are 1. The observation probability $BZ(o_k)$ is the probability of observing pin $o_k$ at a primary output when pin $o_k$ has high impedance state. Such state may comprise a logic value and a high impedance strength. In the case of an enable pin of a tristate circuit element, a fault on the enable pin which always keeps the element enabled usually causes bus contention. The $BZ(o_k)$ term for the output pin of the tristate circuit element is the probability that such contention is generated and observed at a primary output by this kind of fault. As an approximation, BZ terms are set to 1.

The L-terms, or single-level sensitivity statistics, capture the degree of "sensitivity" through an element to the logic states applied to the input pin $i_j$. An input pin $i_j$ of an element is sensitive to an output pin $o_k$ of the element if the input pin state is observed at the output pin. Each L-term represents the sensitivity of pin $i_j$ to pin $o_k$ for a particular input-output logic state combination. For example, the term $L00(i_j, o_k)$ represents the sensitivity of pin $i_j$ to pin $o_k$ when pin $i_j$ is 0 and pin $o_k$ is 0. As defined, pin $i_j$ equal to 0 is observed with pin $o_k$ equal to 0 only if pin $i_j$ stuck-at-1 yields $o_k$ equal to 1 or Z. In the case of LIZ($i_j$, $o_k$), pin $i_j$ equal to 1 is observed with pin $o_k$ equal to Z only if pin $i_j$ stuck-at-0 yields $o_k$ equal to 0 or 1. The degree of sensitivity of each L-term is determined by the number of time frames during application of the test program in which the element is sensitive to the particular input-output state combination.

By way of example, functional block $G_L$ has R input pins $i_1, \ldots, i_j, \ldots, i_R$ and M output pins $o_1, \ldots, o_k, \ldots, o_M$. The probabilities of observing pin $i_j$ through output pin $o_k$ when the logic state on pin $i_j$ is 0 and 1, respectively, are B1($i_j$, $o_k$), and B0($i_j$, $o_k$). For multiple output elements such as shown, all of the output pins $o_1, \ldots o_k, \ldots, o_M$ contribute towards composite observation probabilities B0($i_j$), and B1($i_j$) which represent the overall probability of observation of pin $i_j$ through all element output pins. These composite observation probabilities are calculated with the following equations:

Equation 9

$$P(A \cup B) = P(A) + P(B) - P(A \cap B)$$

where A is B0($i_j$, $o_1$) and B is B0($i_j$, $o_2$), for example. If independent events are assumed, Equation 7 can be simplified:

Equation 10

$$P(A \cup B) = P(A) + P(B) - P(A) P(B)$$

B0($i_j$) (and B1($i_j$)) can therefore be calculated for each input pin $i_1, \ldots, i_j, \ldots, i_R$ with the algorithm below:

Algorithm 1

Figure 2:
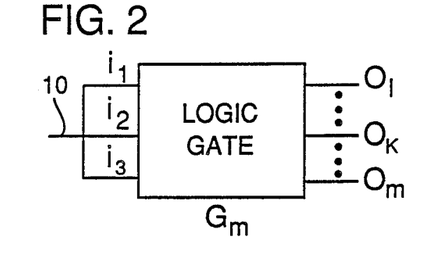
FIG. 2 is a functional block with merged input pins.

B0($i_j$) = B0($i_j$, $o_1$)
for all K=2 to M do
B0($i_j$) = B0($i_j$) + B0($i_j$, $o_k$) — B0($i_j$)B0($i_j$, $o_k$) end
The same algorithm applies to calculate B1($i_j$).

Where a single net 10 feeds multiple pins on an element $G_M$ as shown in FIG. 2, a "merged" input pin is created. A stuck-at-0 fault on one of the shorted input pins is not distinguishable because it would appear on each input pin via the merging connection. The stuck-at-0 fault on the net 10 connecting them, however, is detectable. In this case, the L-terms are measured for the merged pins of the element $G_M$. The sensitivity of the connecting net 10 is thus captured in the L-term statistics, but the sensitivity of the individual pins $i_1$, $i_2$, $i_3$ is lost.

Looking now at Equation 7, it can be seen how the B0($i_j$, $o_k$) is calculated. B-terms at the output pin of the instance—B0($o_k$), B1($o_k$), and BZ($o_k$)—are known from previous calculation for each logic state and high impedance. To carry those observation probabilities across the element, the L-terms that "connect" them to B0($i_j$, $o_k$) must be measured. For example, in Equation 7, B1($O_k$) is the known probability of observing pin $o_k$ equal to 1 at a primary output. L0I($i_j$, $o_k$), when divided by C0($i_j$), is a measured conditional probability of pin $i_j$ equal to 0 being sensitive to pin $o_k$ equal to 1. Multiplying these factors gives a term with the probability of observing pin $i_j$ equal to 0 at a primary output when pin $o_k$ is equal to 1. When this term is added to the other two terms of Equation 7, B0($i_j$, $o_k$) is the probability of observing pin $i_j$ equal to 0 through pin $o_k$ at a primary output. The same holds true for calculating B1($i_j$, $o_k$) in Equation 8.

Estimating Fault Coverage With Single Level Sensitivity Statistics—An Example

Figure 3A:
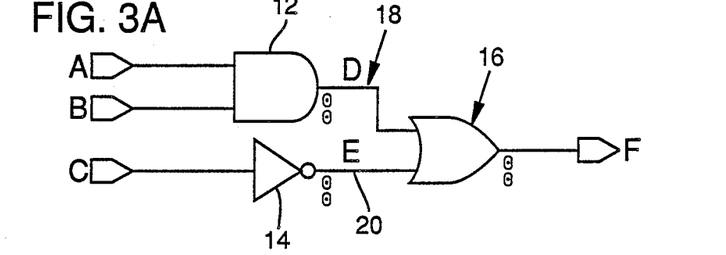
FIGS. 3A–3H illustrate application of the present statistical method for estimating fault coverage of a combinational circuit.
Figure 3B:
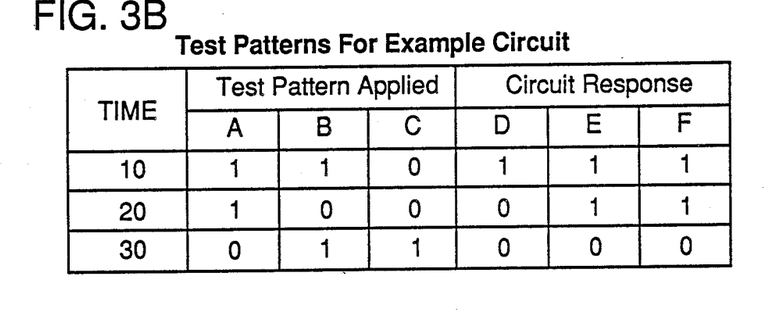
Figure 3C:
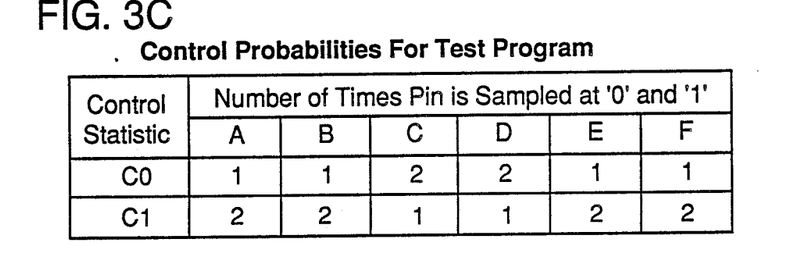

The present method of the statistical analysis employed in estimating fault coverage may be best understood by the method's application to a simple two-level three-gate, combinational circuit. Referring now to FIG. 3A, input pins A and B are inputs to an AND gate 12. Input pin C is a single input pin to an inverter 14. The output pins of these two gates are connected to the two input pins D and E of an OR gate 16 via nets 18 and 20. In this example, these output pins of gates 12 and 14 are also be referred to as D and E since only nets 18 and 20 connect the output pins to the input pins D and E. The output pin of OR gate 16 is labeled F. FIG. 3B shows the test patterns of the test program applied at time frames 10, 20, and 30 and the circuit response at the output pins. The control probabilities, or C-terms, are shown measured in FIG. 3C in the manner described. C0(A), for example, is 1 because input pin A is driven to a 0 logic state once in the three sampled time frames.

Figure 3D:
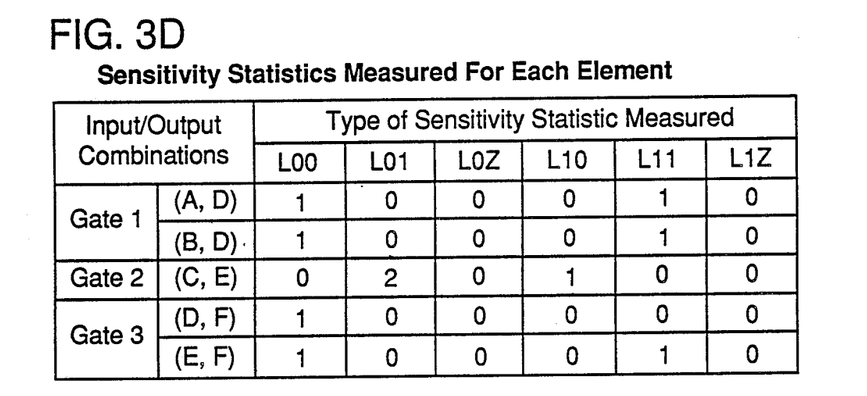

The sensitivity statistics, or L-terms, which are measured during simulation of the circuit, are shown in FIG. 3D for each input-output state combination for each gate 12, 14, 16 of the combinational circuit. The term L00(A,D), for example, is the number of time frames in which a 0 logic state on input pin A is observed at output D when output D is a 0 logic state. In the present example, only in time frame 30 is gate 12 so sensitized because changing pin A from a logic state 0, such as is done by a stuck-at-1 fault, changes the logic state at pin D. The term LI0(A,D), on the other hand, is zero. Though this input-output state combination does occur in time frame 20, the 0 logic state on output pin D is not sensitive to the 1 logic state on input pin A. Changing pin A from logic state 1 has no affect on the logic state 0 of pin D because pin B at a logic state of 0 has disabled the gate. It can also be seen from FIG. 3C that each input-output state combination that does not occur has an L-term of zero.

With both the C-terms and L-terms measured, the observation probabilities B can now be calculated with Equations 7 and 8. Assuming that output pin F is a primary output, then a signal applied directly to it is always observable and therefore B0(F), B1(F), and BZ(F) are each one. The observation probabilities for input pins D and E are therefore:
given B0(F)=1; B1(F)=1; BZ(F)=1

$$B0(D) = B0(F) \cdot \frac{L00(D,F)}{C0(D)} + B1(F) \cdot \frac{L01(D,F)}{C0(D)} + BZ(F) \cdot \frac{L0Z(D,F)}{C0(D)}$$

$$= 1 \cdot \frac{1}{2} + 1 \cdot \frac{0}{2} + 1 \cdot \frac{0}{2} = \frac{1}{2}$$

$$B1(D) = B0(F) \cdot \frac{L10(D,F)}{C1(D)} + B1(F) \cdot \frac{L11(D,F)}{C1(D)} + BZ(F) \cdot \frac{L1Z(D,F)}{C1(D)}$$

$$= 1 \cdot \frac{0}{1} + 1 \cdot \frac{0}{1} + 1 \cdot \frac{0}{1} = 0$$

-continued $$B0(E) = B0(F) \cdot \frac{L00(E,F)}{C0(E)} + B1(F) \cdot$$

$$\frac{L01(E,F)}{C0(E)} + BZ(F) \cdot \frac{L0Z(E,F)}{C0(E)}$$

$$= 1 \cdot \frac{1}{1} + 1 \cdot \frac{0}{1} + 1 \cdot \frac{0}{1} = 1$$

$$B1(E) = B0(F) \cdot \frac{L10(E,F)}{C1(E)} + B1(F) \cdot$$

$$\frac{L11(E,F)}{C1(E)} + BZ(F) \cdot \frac{L1Z(E,F)}{C1(E)}$$

$$= 1 \cdot \frac{0}{2} + 1 \cdot \frac{1}{2} + 1 \cdot \frac{0}{2} = \frac{1}{2}$$

The calculations are repeated at the second gate level to find the observation probabilities at input pins A, B, and C using the previously determined observation probabilities for pins D and E. As described beforehand, BZ terms such as BZ(E) and BZ(D) are approximated as same.

with DD(D)=½; B1(D)=0; BZ(D)=1; BD(E)=1; B1(E)=½;
BZ(E)=1

$$B0(C) = B0(E) \cdot \frac{L00(C,E)}{C0(C)} + B1(E) \cdot$$

$$\frac{L01(C,E)}{C0(C)} + BZ(E) \cdot \frac{L0Z(C,E)}{C0(C)}$$

$$= 1 \cdot \frac{0}{2} + \frac{1}{2} \cdot \frac{2}{2} + 1 \cdot \frac{0}{2} = \frac{1}{2}$$

$$B1(C) = B0(E) \cdot \frac{L10(C,E)}{C1(C)} + B1(E) \cdot$$

$$\frac{L11(C,E)}{C1(C)} + BZ(E) \cdot \frac{L1Z(C,E)}{C1(C)}$$

$$= 1 \cdot \frac{1}{2} + \frac{1}{2} \cdot \frac{2}{2} + 1 \cdot \frac{0}{2} = \frac{1}{2}$$

$$B0(B) = B0(D) \cdot \frac{L00(B,D)}{C0(B)} + B1(D) \cdot$$

$$\frac{L01(B,D)}{C0(B)} + BZ(D) \cdot \frac{L0Z(C,E)}{C0(B)}$$

$$= \frac{1}{2} \cdot \frac{1}{1} + 0 \cdot \frac{0}{1} + 1 \cdot \frac{0}{1} = \frac{1}{2}$$

$$B1(B) = B0(D) \cdot \frac{L10(B,D)}{C1(B)} + B1(D) \cdot$$

$$\frac{L11(B,D)}{C1(B)} + BZ(D) \cdot \frac{L1Z(C,E)}{C1(B)}$$

$$= \frac{1}{2} \cdot \frac{0}{2} + 0 \cdot \frac{1}{2} + 1 \cdot \frac{0}{2} = 0$$

$$B0(A) = B0(D) \cdot \frac{L00(A,D)}{C0(A)} + B1(D) \cdot$$

$$\frac{L01(A,D)}{C0(A)} + BZ(D) \cdot \frac{L0Z(A,D)}{C0(A)}$$

$$= \frac{1}{2} \cdot \frac{1}{1} + 0 \cdot \frac{0}{1} + 1 \cdot \frac{0}{1} = \frac{1}{2}$$

$$B1(A) = B0(D) \cdot \frac{L10(A,D)}{C1(A)} + B1(D) \cdot$$

$$\frac{L11(A,D)}{C1(A)} + BZ(D) \cdot \frac{L1Z(A,D)}{C1(A)}$$

$$= \frac{1}{2} \cdot \frac{0}{2} + 0 \cdot \frac{1}{2} + 1 \cdot \frac{0}{2} = 0$$

Figure 3E:
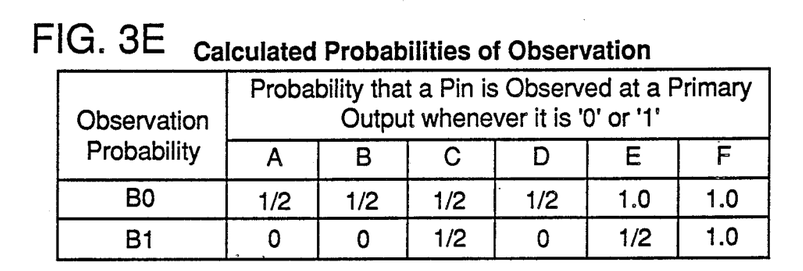

The result of these calculations are gives in FIG. 3E.

Figure 3F:
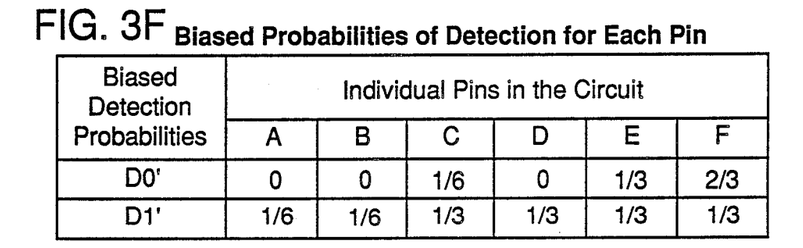
Figure 3G:
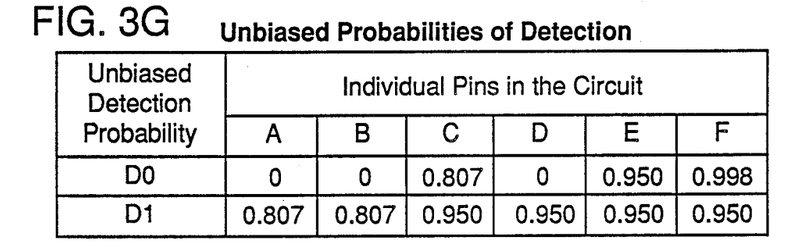
Figure 3H:
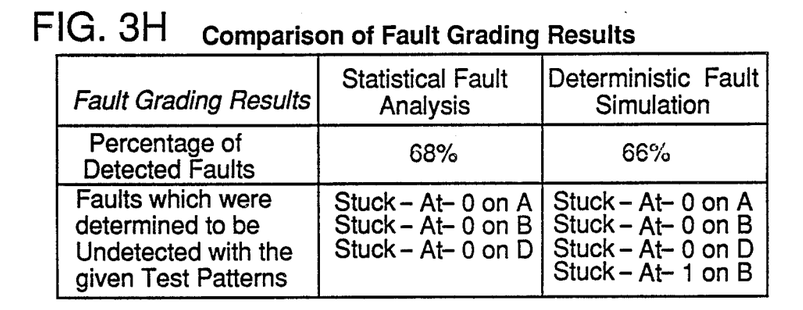

The biased detection probabilities D' are calculated straightforwardly using Equations 1 and 2, with the results shown in FIG. 3F. These detection probabilities are then modified to remove the bias with Equations 3-6, and the results are shown in FIG. 3G. The cutoff percentage is calculated to be 68 percent by computing the arithmetic mean of all the unbiased detection probabilities. In this example, input pin A stuck-at-0, input pin B stuck-at-0, and input pin D stuck-at-0 are considered undetected faults as shown in FIG. 3H. This compares favorably with the results from a deterministic fault simulator, which found 66 percent coverage and only one additional undetected fault at pin B stuck-at-1. To improve the percentage of coverage, the circuit designer would add additional test patterns to the test program until the percentage reached a desired level such as 95 percent.

Measuring the L-Terms With Single-Level Fault Simulation

In the previous example, the L-terms could be measured simply by changing the input logic state and observing the effect on the output logic state. This measurement method is sufficient for combinational circuits with no internal memory states and is the approach proposed by Hi Keung Ma. However, it is inaccurate for sequential circuit elements that have an internal memory state which affects the output logic state. To account for the internal memory state, the present invention employs a unique measurement method referred to herein as single-level fault simulation.

Single-level fault simulation applies to combinational and sequential circuits at the transistor, gate, and block level of design. Its advantage over prior fault-estimating methods, however, is greatest in estimating fault coverage for a sequential functional block. Such a block may be specified by a function that defines the output state from the input state and internal state of the element. This function can be defined in software models of the element.

In single-level fault simulation, the L-terms are explicitly measured by comparing the behavior of the fault-free element with the behavior of a series of "shadow copies." Each shadow copy is a version of the circuit element where an input pin $i_j$ is stuck-at-0 or 1 for the duration of the test program. By so maintaining the stuck-at-fault, it affects the internal memory state of a sequential circuit element in the manner of an actual fault. Prior methods, on the other hand, merely re-apply the stuck-at-fault independently each time frame by changing the present logic state to the opposite logic state and observing the effect on the output logic state.

For each input pin $i_j$ of the element, two shadow copies are created, one with the input pin stuck-at-0 and the other with the input pin stuck-at-1. The number of shadow copies for an element is at a maximum twice the number of unique input pins. (Merged pins are not considered unique. In this case, the stuck-at-faults are applied to the unique net.) In a deterministic fault simulator, by contrast, the number of shadow copies is much greater. Fault effects in a fault simulator are propagated throughout the circuit, which requires creating shadow copies for other elements for that particular fault. The number of copies required, therefore, is unpredictable. In the present measurement method, fault effects of the shadow copies are not propagated beyond the element of interest, but are only used for measuring the L-terms of the element at hand.

Figure 4A:
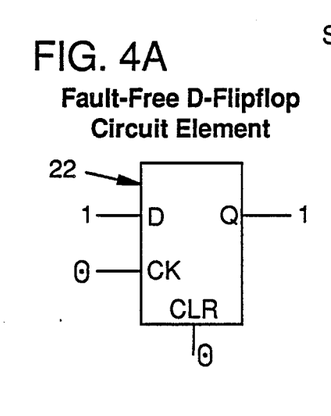
FIGS. 4A–4E illustrate application of single-level fault simulation employed in the present method to measure sensitivity statistics for a sequential functional block.
Figure 4B:
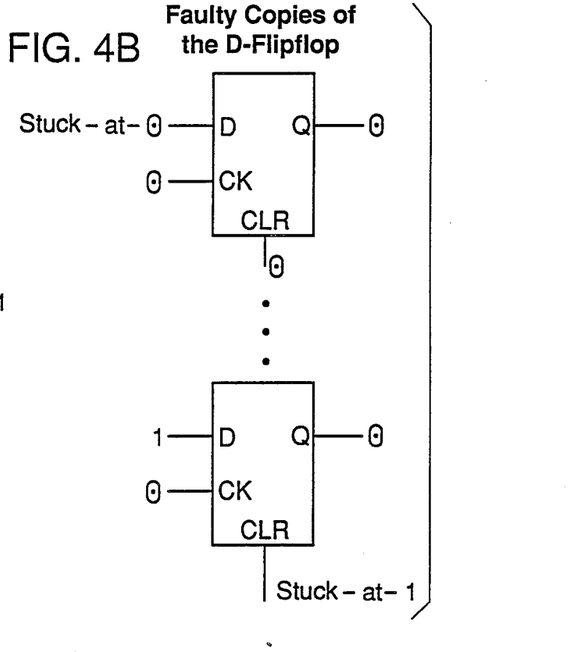
Figure 4C:
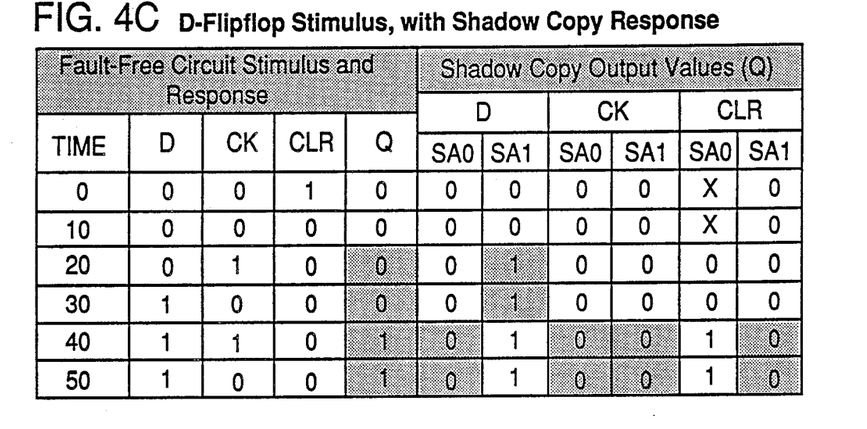

The simulation of a sequential functional block is best explained by example. Referring now to FIG. 4A, an edge triggered D flip-flop 22 with asynchronous clear (active high) is shown. A series of shadow copies of the flip-flop, each with a stuck-at-fault, are illustrated in FIG. 4B. FIG. 4C is a chart showing a set of test vectors comprising the test program applied to the circuit element and two shadow copies for each input pin to account for stuck-at-0 and stuck-at-1 faults. By comparing the fault-free output state with the faulty output state of each shadow copy, the L-terms can be measured. a shaded box in FIG. 4C indicates a point of sensitivity, i.e. where the fault-free and faulty output states on pin Q differ. An unknown state X may occur in the faulty output state where the prior internal memory state of the element is not known. For example, the clear pin (CLR) stuck-at-0 in time frames 0 and 10 the output Q is unknown because the flip-flop cannot be cleared. The present method does not consider an element to be sensitive if the faulty output is unknown and the fault is considered undetected.

Figure 4D:
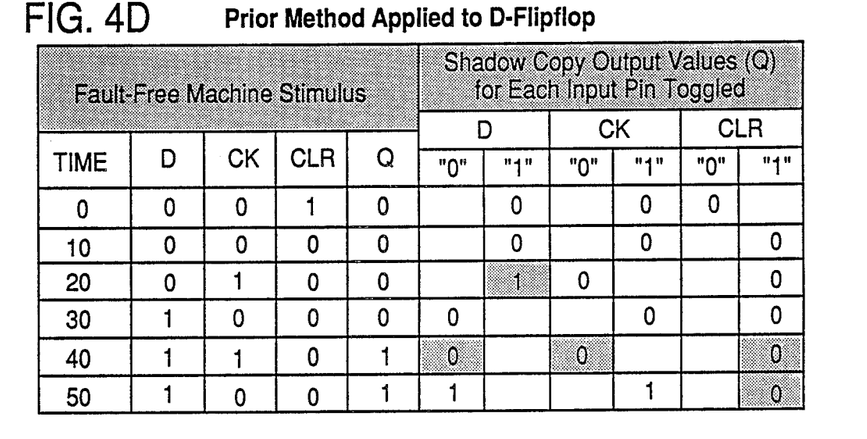

Single-level fault simulation takes into account the internal memory state of the element in measuring the L-terms. At time frame 20, flip-flop 22 is sensitive to the input-output state combination of pin D equal to 0 and pin Q equal to 1 because the clock signal CK is present, and the D stuck-at-1 fault input drives the Q output pin to a different output state. The flip-flop 22 remains sensitive to this input-output state combination in time frame 30 because the active edge of the clock signal CK is now absent and the internal memory state of the shadow copy preserves the fault. This measurement contrasts with prior measurement methods which do not account for the internal memory state and hence introduce significant error into measurement of observability. That method would find no sensitivity at time frame 30 since the output logic state at pin Q does not change if the input logic state at pin D is toggled from 1 to 0. The same measured difference occurs in time frame 50 for a D,Q input-output state combination of 1 and 1. FIG. 4D indicates those points of sensitization found by the prior method. Note that only half of the points found in the present method are found in FIG. 4D. The results of the single-level fault simulation with the test patterns in FIG. 4C are shown in FIG. 4E.

Figure 4E:
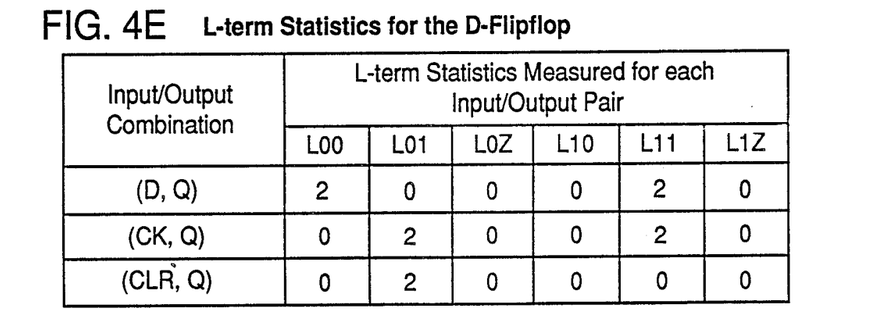

The B-terms are calculated with Equations 7 and 8 by measuring the C-terms from FIG. 4C and L-terms from FIG. 4E. B0(Q), B1(Q), and BZ(Q) are either primary outputs or have been previously calculated. Because L10(CLR,Q), L11(CLR,Q), and L1Z(CLR,Q) are all zero, one can see that B1(CLR,Q) is also zero, which implies that the clear signal CLR is not observable through the output pin Q when CLR=1. The detection probability D for each logic state at each input pin can then be calculated from equations 1-6, and the estimated fault coverage of this test program calculated by computing the arithmetic mean of the unbiased D-terms.

The Fault Estimating System

Figure 5:
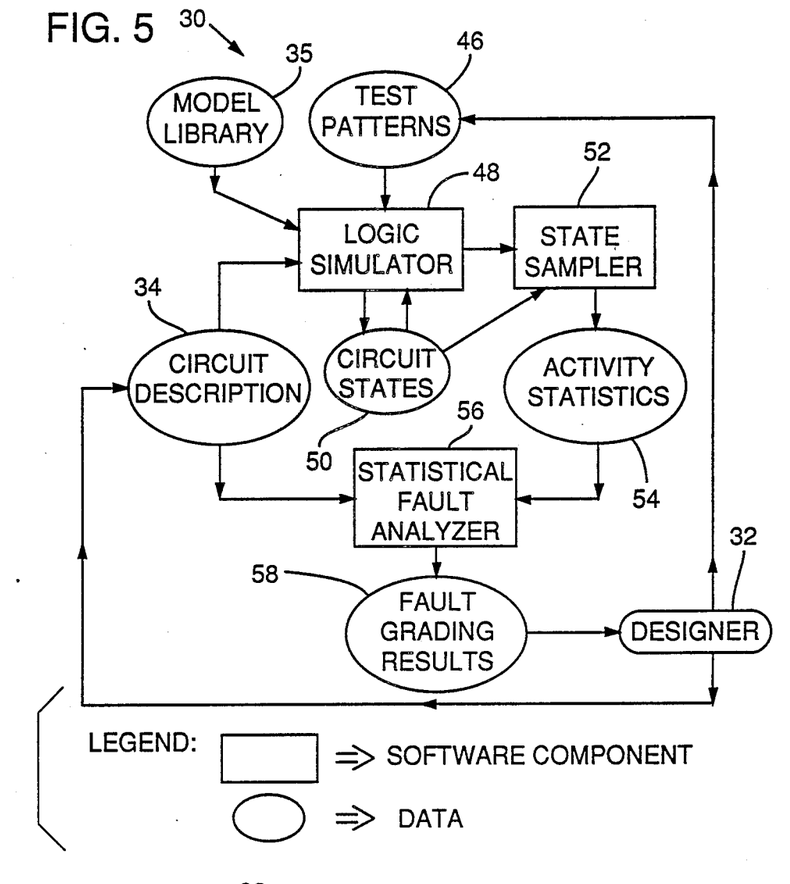
FIG. 5 is a functional block diagram of a fault-estimating apparatus according to the invention.
Figure 6:
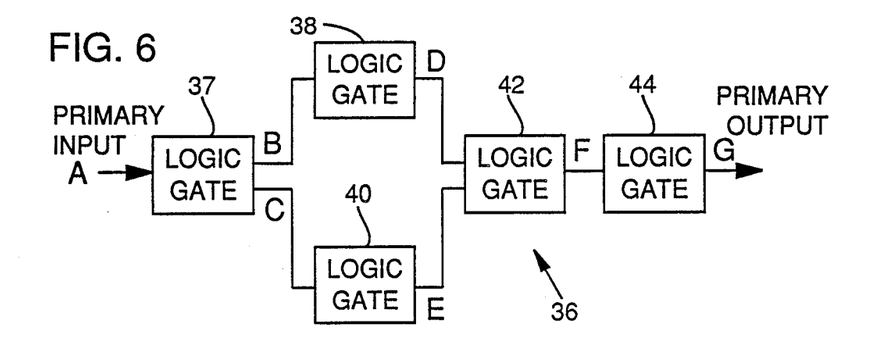
FIG. 6 is a schematic representation of a circuit under test.

FIG. 5 is a functional block diagram of a fault-estimating system 30 according to the invention. As shown in FIG. 5 circled elements represent data generated by the system and rectangular elements represent software elements thereof. Initially, a circuit designer 32 describes a circuit design by entering a circuit description 34 into a computer on which the software system 30 is running. This description 34 includes identification of the circuit elements and how they are interconnected. Models of the different circuit elements may be drawn from a commercially available model library 35. A sequential circuit element such as D flip-flop 22, for example, has a model that includes input pins, internal operation, and output pins. FIG. 6 is a schematic representation of a multilevel circuit 36 with several elements 37, 38, 40, 42, 44.

The designer 32 also creates a test program 46 comprising a set of test vectors or patterns to be applied to the primary inputs of circuit 36. The fault-estimating system 30 will apply the present method to estimate the effectiveness of this test program in finding defectively manufactured versions of the circuit.

A logic simulator 48 receives the circuit description 34 and test program 46 and simulates the circuit's behavior in response to the test program. As the circuit description is loaded by the simulator, each element that requires single-level fault simulation has a list of faulty copies created. The simulator keeps track of current logic states of pins and internal memory states of sequential circuit elements in data referred to as circuit states 50. The simulator 48 also performs the single-level fault simulation in a manner to be described.

The logic simulator 48 calls a state sampler routine 52 to sample the results of the single-level fault simulation at the periodic sampling times. The sampling rate should be at least as fast as the test patterns are applied to the primary inputs. The sampling rate, however, must also be slow enough to allow the circuit to fully settle after application of new logic states to the primary inputs. This assures that all legal internal states are counted for statistically accurate results. The state sampler 52 checks the state of every pin and thereby measures the sensitivity of each circuit element. From the data gleaned, the sampler 52 measures the C-terms and L-terms and stores the data as activity statistics 54 that statistically represent how the behavior of the circuit 36 during the test program.

Figure 7:
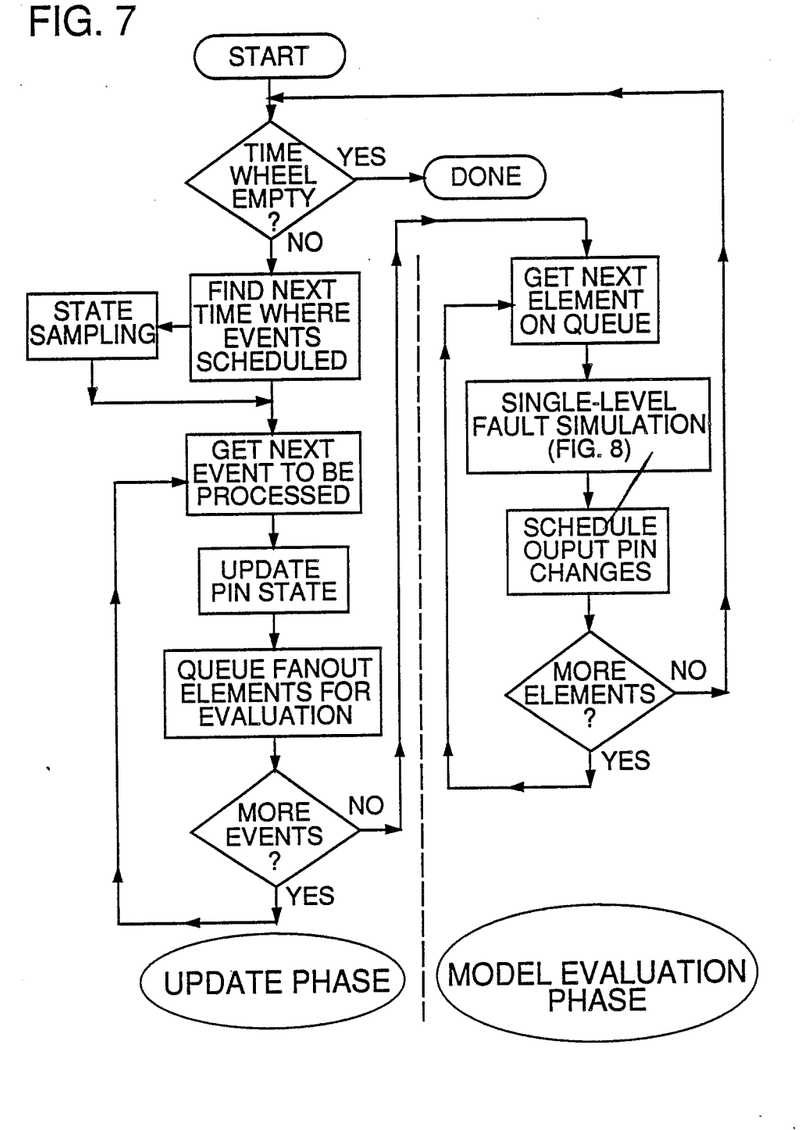
FIG. 7 is a flowchart illustrating the logic simulation algorithm employed for applying the test patterns to the circuit and executing single-level fault simulation.

FIG. 7 is a flowchart that illustrates a "two-pass" simulation algorithm employed by logic simulator 48 to apply the test program 46 to the circuit description 34 and execute the single-level fault simulation. It should be understood that single-level fault simulation may be implemented in other algorithms, such as a single pass, as well. The two-pass algorithm includes an "update" phase and an "evaluation" phase. In the update phase, previously scheduled logic state changes for pins are processed. In the evaluation phase, simulation models for each element affected by a logic state change are evaluated. The two phases are shown divided by a dashed line in FIG. 7. It is assumed that all circuit elements herein have an inertial delay greater than zero for each output pin of an element.

At the start of the logic simulation, the simulator 48 converts the test patterns in the program 46 into "events" and schedules the events into a time wheel. The time wheel is divided into slots representing time steps, the smallest resolution of time in the circuit. An event is a logic state change on a pin at a particular time step. The time wheel is a scheduling structure that schedules each event on a list in a time slot corresponding to the event's time step. For example, within program 46, all events that are scheduled to occur at the 10 nanosecond time step during circuit operation are grouped into time slot 10 on an event list. When all events are scheduled, simulator 48 "turns" the wheel until it finds the next time slot for which events are scheduled.

At this point in the simulation algorithm, state sampler 52 may be called by logic simulator 48 if the current time point is greater than or equal to the next scheduled sampling time frame. If called, the state sampler 52 looks at the circuit states in the fault-free circuit and examines the sensitivity of each element as determined by methods such as single-level fault simulation. From this data, the sampler 52 updates activity statistics 54 for those pins and elements that have been processed since the last sampling time frame. It may take several passes through the algorithm before a sampling time frame is reached. On the first pass, of course, no single-level fault simulation has yet occurred.

From the event list associated with the current time point in the event wheel, simulator 48 retrieves the next event and processes it by updating the logic states of pins affected by the event. The simulator then determines which elements are driven by the affected pin. These elements that the pin drives are placed on an element queue.

The update phase continues until all events on the list for the present time step are processed. The result of this processing is an element queue containing elements that are connected to an affected pin during a specific time step.

Figure 8:
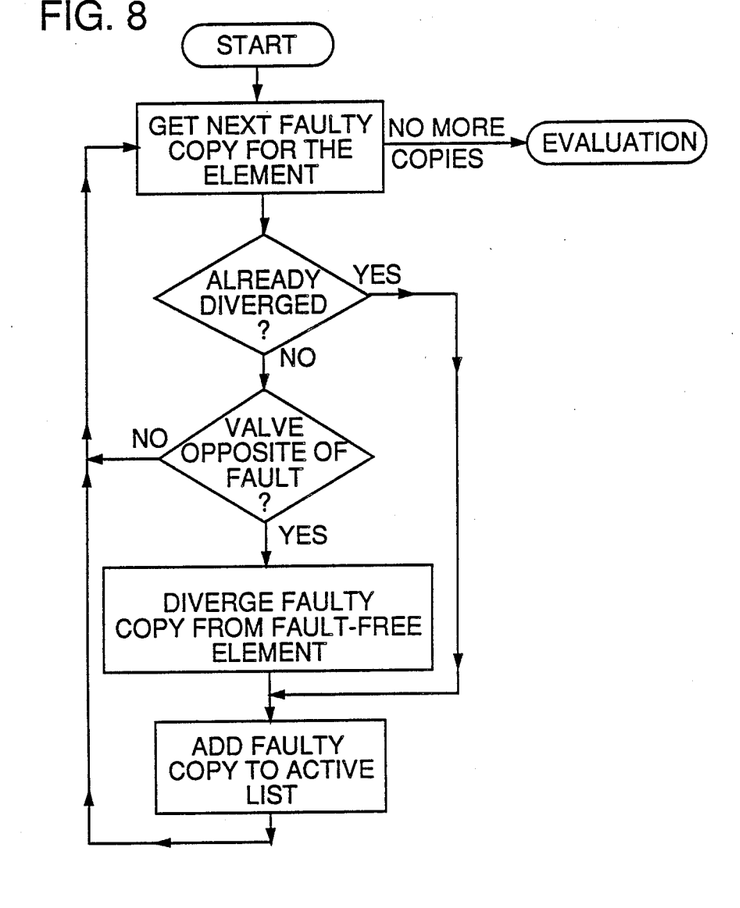
FIG. 8 is a flowchart illustrating the first phase of single-level fault simulation.

When the event list is exhausted, the algorithm shifts to the evaluation phase. Simulator 48 selects from the element queue the next element. Primitive gates that have a sensitivity model are only logically simulated at this time. Nonprimitive or behavioral models of elements are single-level fault simulated. (Behavioral models are defined by the designer; sensitivity models are provided by a vendor who has knowledge of an element's characteristics.) Referring now to FIG. 8, the steps of single-level fault simulation are illustrated. From the list of faulty shadow copies created at circuit load time for the selected element, the simulator 48 retrieves a faulty copy and proceeds to check if the copy should be simulated as part of the single-level fault simulation. This selective simulation of copies minimizes the memory required for such simulation and also the time required for the simulation. The result is a faster, more compact system 30. If the selected shadow copy has already been "diverged," or created in memory earlier in time from the fault-free element in another evaluation, then the copy is added to an active list. If the copy has not been diverged, on the other hand, then it is checked to determine if it should be diverged by comparing the input logic state on the affected pin against the stuck-at-fault state on the input pin of the shadow copy. If the input logic states are different, then the copy is diverged and, from the fault-free element, added to the active list. If the input logic states are the same, however, then the stuck-at-fault cannot be observed, and the copy is not created in memory. When a faulty copy is diverged, the internal memory states of the fault-free element are also replicated and associated with the faulty copy.

Figure 9:
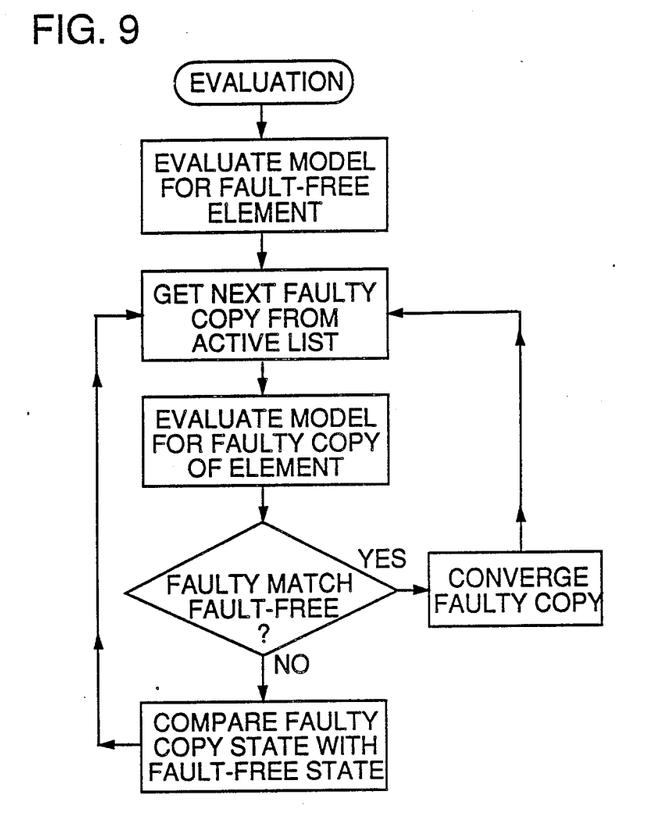
FIG. 9 is a flowchart illustrating the second phase of single-level fault simulation.

After all faulty copies have been checked for active status, the single-level fault simulation proceeds to the evaluation phase of the algorithm illustrated in FIG. 9. The fault-free element is first evaluated by executing the simulation model for the element and determining the output logic states that result from the element's behavior. These states are stored as a reference for comparison with the output states of the faulty copies on the active list.

Each of the faulty copies on the active list is then evaluated. The simulator 48 executes the simulation model for the circuit element using the logic states associated with the faulty copy. If the internal/output states of the faulty copy after simulation are identical to the fault-free internal/output states, the fault is not observed through the element at this time step. The active copy is then "converged," or destroyed, and the memory it occupied released to further accelerate the single-level fault simulation. If, however, the internal/output states of the fault-free and faulty copies do not match, the states are compared, and the sensitivity of the element measured. In the comparison a series of L flags each representing a different sensitization mode (such as an input-output state combination 0, 0) are set to True if the mode is sensitive and False if it is not. These flags, for each element, are used by the sate sampler 52 to decide which L-terms for that element are incremented at the next sample time. Following the comparison, the next active faulty copy is fetched from the active list, simulated, and the comparison steps repeated until all active copies have been compared to the fault-free comparison.

Referring again to FIG. 7, after the single-level fault simulation is complete (or the sensitivity model executed if the element is a primitive gate), the simulator 48 schedules the logic state changes for the fault-free elements as events on the time wheel. The appropriate time slot for each event is the current time step plus the internal delay for each output pin.

After scheduling these newly created events, the simulator returns to the element queue for the next element. The single-level fault simulation (and/or sensitivity model execution) and output pin scheduling are then repeated until all elements on the queue have been evaluated. The algorithm then repeats for each time point having an event list.

Referring again to FIG. 5, once the simulation algorithm for the test program is finished, a statistical fault analyzer routine 56 analyzes the activity statistics 54 and circuit description 34 according to Equations 1–8. As a last step, the analyzer 56 calculates the coverage percentage, and the list of undetected faults. This data is stored as fault-grading results 58.

The designer 32 analyzes the results 58 to determine if the test program 46 should be changed or augmented to achieve a target coverage. The simulation is again run, the statistics measured, the statistical analysis run, the results analyzed by the designer, and additional patterns added to the test program until the target coverage is reached. The final test program 46 is then run through a conventional deterministic fault simulator to verify the percentage of detected faults covered by the test program.

The present method can be summarized with reference to FIG. 6. The elements of circuit 36 may be both combinational and sequential circuits and be functionally described by the designer or, if the primitive gates, have sensitivity models. Following entry of the circuit's description 34 and the test program 46 in the system 30, logic simulator 48 executes its two-pass algorithm. State sampler 52 reads the appropriate L flags and the circuit states 50 to measure the L-terms and C-terms, respectively. These terms are updated in the activity statistics 54 for each pin of each element for the test program. Once the program 46 has run its course, the statistical fault analyzer 56 calculates the B-terms and the D-terms. The analyzer 56 communicates with the description 34 of circuit 33 to determine the order of elements in a breadth-first search. Starting then with element 44, B0(G), B1(G), and BZ(G) for output pin G are assumed to be 1 because G is a primary output. The analyzer 56 then retrieves the L-terms and C-terms for element 44 and calculates B1(F) and B0(F). The term BZ(F) is approximated as 1. The B-terms for pins D and E are similarly calculated, using the L-terms and C-terms measured for element 42. The calculations continue in like manner back to the primary input A. Note that the element 37 has two output pins, and hence, Equations 9 and 10 come into play in calculating B0(A) and B1(A).

From the B-terms, unbiased D-terms for each pin are calculated with Equations 1-6. The analyzer completes the analysis by calculating the fault coverage percentage and determines the list of undetected faults. These results are stored as fault-grading results 58 for review by the designer 12.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. Apparatus for estimating fault coverage of a set of test vectors applied to a digital circuit which includes in its circuit elements a sequential element and whose circuit description may be measured into a computer for simulation, comprising:

means for defining an output of a sequential element in terms of an input and internal state of the element, the element having an input pin to receive an input and an output pin to provide an output;

means for creating for at least one input pin of the sequential element at least one faulty copy of the element, a copy with the input pin having an input stuck at a logic 1 or a copy having the input stuck at a logic 0, said input being a fault;

means for receiving a set of test vectors to be applied to the digital circuit;

means for simulating the behavior of the digital circuit in response to the test vectors, the simulation including simulating the behavior with the sequential element and with a faulty copy of the element in place thereof;

means for determining from the simulations the outputs of the sequential element and of the faulty copy;

means for comparing the output of the sequential element with the output of a faulty copy to determine which input-output combinations for the sequential element are sensitive to a fault on the input pin, a combination defined as sensitive if the output of the sequential element and a faulty copy differ after taking into account the input and the internal state if the sequential element; and means for estimating, based on the determined sensitivities, a percentage of faults in the digital circuit covered by the set of test vectors.

2. The apparatus of claim 1 in which the means for determining the outputs of the sequential element and the faulty copy includes means for distinquishing between outputs of logic 1, logic 0 and a high impedance state.

3. The apparatus of claim 1 in which the estimating means includes:

sampling means for sampling the simulation of the digital circuit over a number of time frames, the sampling means storing a count of the number of time frames in which an input pin of the sequential element has an input of a logic 1 and a count of the number of time frames the input pin has a logic 0, and further storing the number of time frames in which each input-output combination is sensitive; and analyzing means for:

calculating from the counts and sensitivities stored by the sampling means how often an input on an input pin can be observed at a primary output of the digital circuit, said input being observed if a change in the input at the input pin causes a change in the input at the primary output, calculating from the observabilities and the counts stored by the sampling means a probability of detection of a fault at each input pin of each circuit element in the digital circuit, calculating an arithmetic means of the detection probabilities, and providing a fault coverage percentage by dividing the number of faults with detection probabilities above the arithmetic means by the total number of potential faults in the digital circuit.

4. The apparatus of claim 3 wherein the analyzing means includes means for listing as an undetected fault any fault with a detection probability below the arithmetic mean.

5. The apparatus of claim 1 including means for limiting the number of faulty copies simulated, said means simulating a copy only if the copy has a fault at an input pin with a logic value different from that applied to the corresponding input pin of the sequential element.

6. The apparatus of claim 1 including means for removing from the computer, after simulation, a faulty copy having an internal state and output identical to the internal state and output of the sequential element.

7. A method of estimating fault coverage of a set of test vectors applied to a digital circuit which includes in its circuit elements a sequential element and whose circuit description may be entered into a computer for simulation, comprising:

defining an output of a sequential element in terms of an input and internal state of the element, the element having an input pin to receive an input and an output pin to provide an output;

creating for at least one input pin of the sequential element at least one faulty copy of the element, a copy with the input pin having a input stuck at a logic 1 or a copy having the input stuck at a logic 0, said input being a fault;

receiving a set of test vectors to be applied to the digital circuit;

simulating the behavior of the digital circuit in response to the test vectors, the simulation including simulating the behavior with the sequential element and with the faulty copy of the element in place thereof;

determining from the simulations the output of the sequential element and the faulty copy;

comparing the output of the sequential element with the output of a faulty copy to determine which input-output combinations for the sequential element are sensitive to a fault on the input pin, a combination defined as sensitive if the output of the sequential element and a faulty copy differ after taking into account the input and the internal state of the sequential element; and estimating, based on the determined sensitivities, a percentage of faults in the digital circuit covered by the set of test vectors.

8. The method of claim 7 in which determining the outputs of the sequential element and the faulty copy includes distinquishing between outputs of logic 1, logic 0 and a high impedance state.

9. The method of claim 7 in which estimating the percentage of faults based on the determined sensitivities comprises:

sampling the simulation of the digital circuit over a number of time frames;

storing a count of the number of time frames in which an input pin of the sequential element has an input of a logic 1 and a count of the number of time frames the input pin has a logic 0;

storing the number of time frames in which each input-output combination is sensitive;

calculating from the stored counts and sensitivities how often an input on an input pin can be observed at a primary output of the digital circuit, said input being observed if a change in the input at the input pin causes a change in the output at the primary output;

calculating from the observabilities and the stored count a probability of detection of a fault at each input pin of each circuit element in the digital circuit;

calculating an arithmetic means of the detection probabilities; and calculating a fault coverage percentage by dividing the number of faults with detection probabilities above the means by the total number of potential faults in the digital circuit.

10. The method of claim 9 including listing as an undetected fault any fault with a detection probability below the arithmetic mean.

11. The method of claim 7 including limiting the number of faulty copies required for simulation by simulating a copy only if the copy has a fault at an input pin with a logic value different from that applied to the corresponding input pin of the sequential element.

12. The method of claim 7 including removing from the computer, after simulation, a faulty copy having an internal state and output identical to the internal state and output of the sequential element.

13. The method of claim 7 wherein estimating the percentage of faults covered is followed by entering additional test vectors to be applied to the digital circuit.

14. A method of determining which input-output combinations for a sequential element in a digital circuit are sensitive to a fault on an input pin of the sequential element, comprising:

defining an output of the sequential element in terms of an input and internal state of the element, the element having an input pin to receive an input and an output pin to provide an output;

creating for at least one input pin of the sequential element at least one faulty copy of the element, a copy with the input pin having an input stuck at a logic 1 or a copy having the input stuck at a logic 0, said input being a fault;

simulating the behavior of the sequential element in response to an input applied to the input pin, the simulation including simulating the behavior with the sequential element and with the faulty copy of the element in place thereof;

determining from the simulation the outputs of the sequential element and the faulty copy; and comparing the output of the sequential element with the output of a faulty copy to determine which input-output combinations for the sequential element are sensitive to a fault on the input pin, a combination defined as sensitive if the output of the sequential element and a faulty copy differ after taking into account the input and the internal state of the sequential element.

* * * * *

UNITED STATES PATENT AND TRADEMARK OFFICE
CERTIFICATE OF CORRECTION

PATENT NO. : 4,937,765

DATED : June 26, 1990

INVENTOR(S) : Paul Shupe, Michael Ausec, William Berg, William Diss

It is certified that error appears in the above-identified patent and that said Letters Patent is hereby corrected as shown below:

Title page,
item [56], Other Publications, ""Product Description Stategrade," Gareway Design Automation Corporation, 1988.", should read --"Product Description Stategrade," Gateway Design Automation Corporation, 1988.--

Column 4, line 55, "above." should read --above, which are incorporated herein by reference.--

Column 15, line 30 "measured" should read --entered--.

Signed and Sealed this

Twenty-second Day of June, 1993

Attest:

MICHAEL K. KIRK

Attesting Officer

Acting Commissioner of Patents and Trademarks